United States Patent
Iwai et al.

(10) Patent No.: US 11,342,300 B2
(45) Date of Patent: May 24, 2022

(54) ELECTRONIC DEVICE AND MANUFACTURING METHOD THEREOF AND MANUFACTURING METHOD OF DRIVER IC

(71) Applicant: Japan Display Inc., Tokyo (JP)

(72) Inventors: Youhei Iwai, Tokyo (JP); Hideaki Abe, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 17/001,701

(22) Filed: Aug. 25, 2020

(65) Prior Publication Data
US 2021/0066238 A1    Mar. 4, 2021

(30) Foreign Application Priority Data

Aug. 29, 2019  (JP) .............................. JP2019-156735

(51) Int. Cl.
*H01L 23/00* (2006.01)
*H01L 23/31* (2006.01)
*H01L 21/78* (2006.01)
*H01L 21/304* (2006.01)

(52) U.S. Cl.
CPC .......... *H01L 24/73* (2013.01); *H01L 21/3043* (2013.01); *H01L 21/78* (2013.01); *H01L 23/3171* (2013.01); *H01L 24/16* (2013.01); *H01L 24/32* (2013.01); *H01L 2224/73204* (2013.01); *H01L 2224/83002* (2013.01); *H01L 2224/83007* (2013.01); *H01L 2224/83203* (2013.01); *H01L 2224/83851* (2013.01); *H01L 2924/10156* (2013.01); *H01L 2924/10158* (2013.01)

(58) Field of Classification Search
CPC ......... H01L 24/17; H01L 24/83; H01L 24/81; H01L 24/16; H01L 23/32; H01L 2224/32225; H01L 2924/3511; H01L 2224/73204; H01L 2924/10156
See application file for complete search history.

(56) References Cited

U.S. PATENT DOCUMENTS 6,297,868 B1 * 10/2001 Takenaka ............ G02F 1/13452
                                                                 349/151

FOREIGN PATENT DOCUMENTS

JP    2003-347353 A    12/2003
JP    2004-252178 A     9/2004

* cited by examiner

*Primary Examiner* — Jasmine J Clark
(74) *Attorney, Agent, or Firm* — Xsensus LLP

(57) ABSTRACT

The purpose of the invention is to counter measure a disconnection between the driver IC and the terminal when the terminal area of the electronic device is curved. One of the structures is as follows. An electronic device comprising: a driver IC installed in a terminal area, the terminal area being curved, wherein the driver IC has a circuit and plural bumps, the driver IC has a tapered portion formed on an opposite surface from a surface that the plural bumps are formed, the tapered portion overlaps with an outer most bump of the plural bumps.

15 Claims, 19 Drawing Sheets

FIG. 12

|  | YOUNG'S MODULUS (MPa) | POISSON'S RATIO |
|---|---|---|
| IC 10 | 110,000 | 0.20 |
| ACF 20 | 2,000 | 0.28 |
| SUBSTRATE 30 | 77,000 | 0.22 |

|  |  | L1=30mm | | L1=20mm | |
|---|---|---|---|---|---|
| L2 | L1×3~5% | 0.9~1.5 | | 0.6~1.0 | |
| L4 | L2×20~50% | 0.18~0.45 | 0.30~0.75 | 0.12~0.30 | 0.20~0.50 |

L1: LENGTH OF IC; L2, L4: DEFINED IN FIG.17

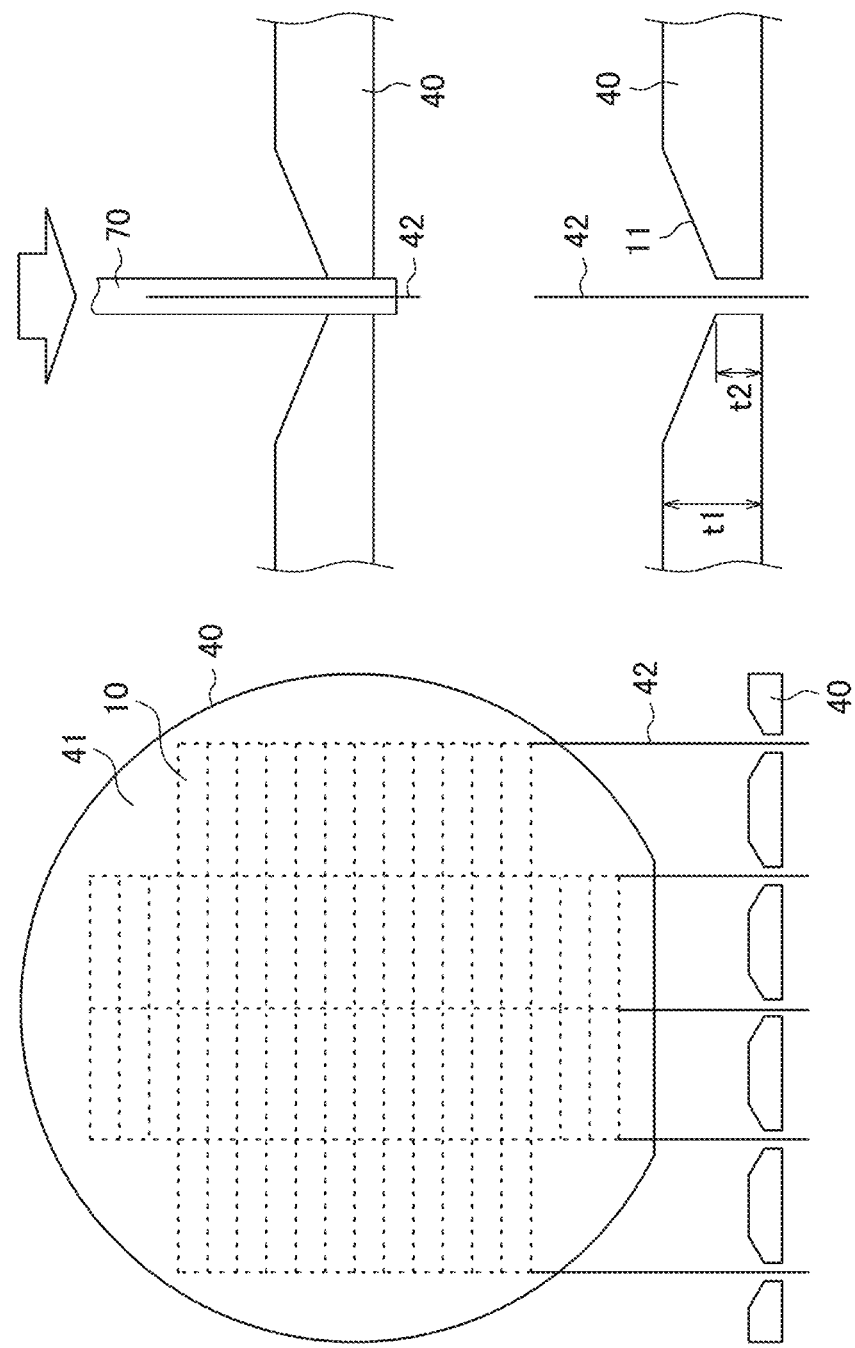

ELECTRONIC DEVICE AND MANUFACTURING METHOD THEREOF AND MANUFACTURING METHOD OF DRIVER IC

CLAIM OF PRIORITY

The present application claims priority from Japanese Patent Application JP 2019-156735 filed on Aug. 29, 2019, the content of which is hereby incorporated by reference into this application.

BACKGROUND OF THE INVENTION

(1) Field of the Invention

The present invention relates to the electronic devices, like display devices, in which the substrates can be used in curved state.

(2) Description of the Related Art

Self-luminous type display devices like the organic EL display device and the micro-LED display device, and other display devices like the liquid crystal display device and the electrophoresis display device are sometimes required to be used in curved state because of their application and their design needs. In addition, not only display devices but touch panels or sensor substrates for e.g. photo sensors are also sometimes required to be used in curved state according a design of equipment in which those devices are installed.

In an electronic device including a display device, a driver IC is installed on the terminal area. When the electronic device as the display device is used in curved state, the terminal area is also curved, consequently, a stress is generated in the driver IC; thus, there occurs a danger that the driver IC is broken. Patent document 1 discloses a structure in which the driver IC is separated into two ICs to alleviate the stress applied to the driver ICs when the display device is curved, and thus, to avoid a breaking of the driver ICs.

On the other hand, the driver IC is formed from silicon, which is a hard material, therefore, if the corner of the IC has a sharp rectangle, the IC tends to have a chip in the corner. Patent document 2 discloses a structure in which the corner of the driver IC is chamfered to avoid a chip in the corner.

PRIOR TECHNICAL DOCUMENT

Patent Document

Patent document 1: Japanese patent application laid open No. 2004-252178
Patent document 2: Japanese patent application laid open No. 2003-347353

SUMMARY OF THE INVENTION

The driver IC, which is generally disposed in the terminal area of the electronic device as the display device, is connected to the device via an anisotropic conductive resin film (ASC). When the electronic device as the display device is curved, a tensile stress is generated in the anisotropic conductive resin film at edges of the driver IC. If the Young's modulus of the driver IC is larger than the Young's modulus of the substrate, the tension becomes further larger. Consequently, a disconnection occurs between the bump of the driver IC and the terminal of the electronic device as the display device. Even the driver IC is not broken, if a disconnection occurs between the driver IC and the electronic device as the display device, the electronic device as the display device becomes defective.

The purpose of the present invention is to mitigate the tensile stress in the anisotropic conductive resin film, especially at the edges of the driver IC, when the electronic device as the display device is curved; thus, to avoid a disconnection between the driver IC and the electronic device as the display device.

The present invention overcomes the above explained problem; the concrete structures are as follows.

(1) An electronic device comprising: a driver IC installed in a terminal area, the terminal area being curved,
wherein the driver IC has a circuit and plural bumps,
the driver IC has a tapered portion formed on an opposite surface to a surface that the plural bumps are formed,
the tapered portion overlaps with an outer most bump of the plural bumps.

(2) A manufacturing method of an electronic device comprising:
the electronic device characterized in that a driver IC is installed in a terminal area, the terminal area is to be curved,
wherein the driver IC has a circuit and plural bumps,
the driver IC has a first surface where plural bumps are formed, and a second surface where a tapered portion is formed, the second surface is an opposite surface to the first surface,
the tapered portion overlaps with an outer most bump of the plural bumps and the circuit,
the manufacturing method including:
connecting the driver IC to the terminal area via an anisotropic conductive resin film by thermal compression with a pressure head having a spacer,
a thickness of the spacer is thinner at a place corresponding a center of the driver IC than a thickness at a place corresponding to the tapered portion of the driver IC.

(3) A manufacturing method of a driver IC comprising:
the driver IC characterized in that a first surface where plural bumps are formed, and a second surface where a tapered portion is formed, the second surface is an opposite surface to the first surface,
the tapered portion overlaps with the circuit,
the tapered portion overlaps with an outer most bump of the plural bumps,
the manufacturing method including:
forming the tapered portion by cutting a silicon wafer along a separating line with a first blade of which a tip has a tapered portion,
after that, the driver IC is separated from the silicon wafer using a second blade.

BRIEF DESCRIPTION OF THE DRAWINGS

FIG. 12 is a table that shows Young's modulus and Poisson ratio of elements used in simulation;

FIG. 25 is a cross sectional view in which the individual IC chips are separated from the silicon wafer with the second blade.

DETAILED DESCRIPTION OF THE PREFERRED EMBODIMENTS

The present invention will be described in detail referring to the following embodiments. The embodiments are explained mainly for the liquid crystal display device; however, the present invention can be applied to various display devices like the electrophoresis display device, which has photo-electrical layers, the self-luminous display devices such as the organic EL display device and the micro LED device, and so forth. The present invention is applicable to other electronic devices like sensor devices, e.g. the external touch sensor or the finger print sensor, and etc. In general, the present invention can be applied to the electronic devices, including various display devices, and various sensors, in which the driver IC is installed on the curved surface.

Embodiment 1

Figure 1:
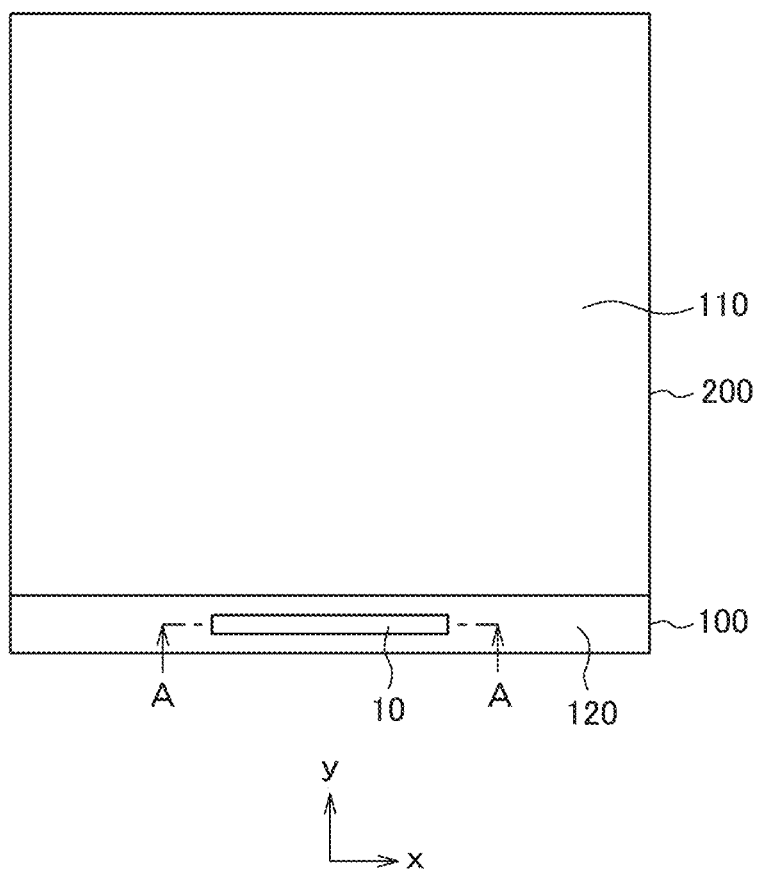
FIG. 1 is a plan view of the liquid crystal display device.

FIG. 1 is a plan view of the liquid crystal display device to which the present invention is applied. In FIG. 1, the TFT substrate 100 and the counter substrate 200 oppose to each other; the liquid crystal is sandwiched between the TFT substrate 100 and the counter substrate 200; the pixel electrodes and TFTs (Thin Film Transistor) and so forth are formed on the TFT substrate 100. The display area 110 is formed in the area in which the TFT substrate 100 overlaps the counter substrate 200. In the display area 110, the scan lines extend in lateral direction (x direction) and are arranged in longitudinal direction (y direction); the video signal lines extend in longitudinal direction and are arranged in lateral direction.

The terminal area 120 is formed on the TFT substrate 100 where the counter substrate 200 does not overlap; the driver IC 10 is connected via anisotropic conductive film to the terminal area 120. When a lateral size (in x direction) of the display area becomes wider, the number of the video signal lines increase; consequently, a lateral length of the driver IC becomes longer.

Figure 2:
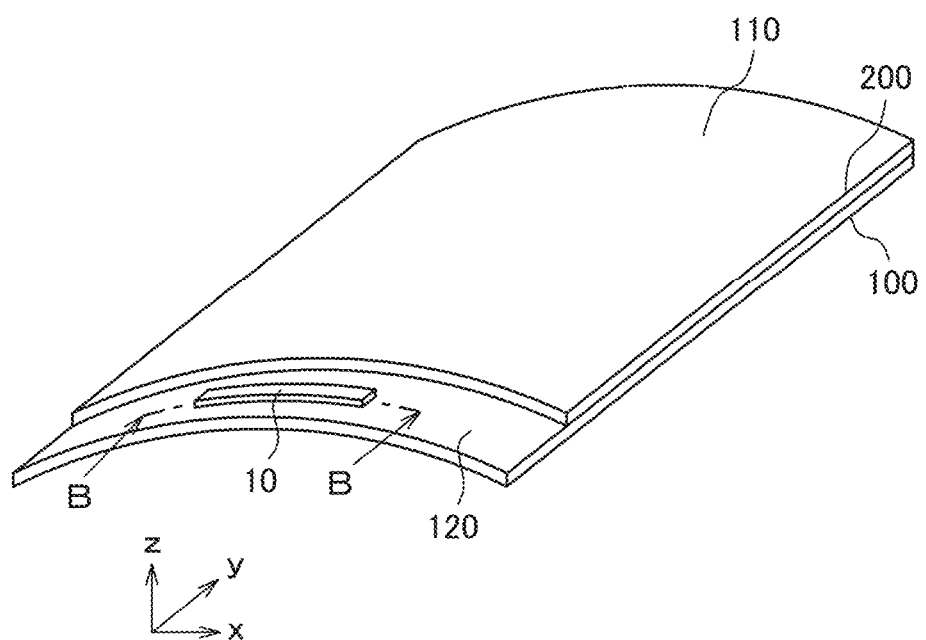
FIG. 2 is a perspective view in which the liquid crystal display device of FIG. 1 is curved.

FIG. 2 is a perspective view in which the display device of FIG. 1 is curved in the x axis. The driver IC 10, which is installed in the terminal area 120, also curves along with the display device. However, since the driver IC 120 is ridged, there arises a tensile stress to peel off the driver IC 10 from the terminal area 120 at the edge of the driver IC.

Figure 3:
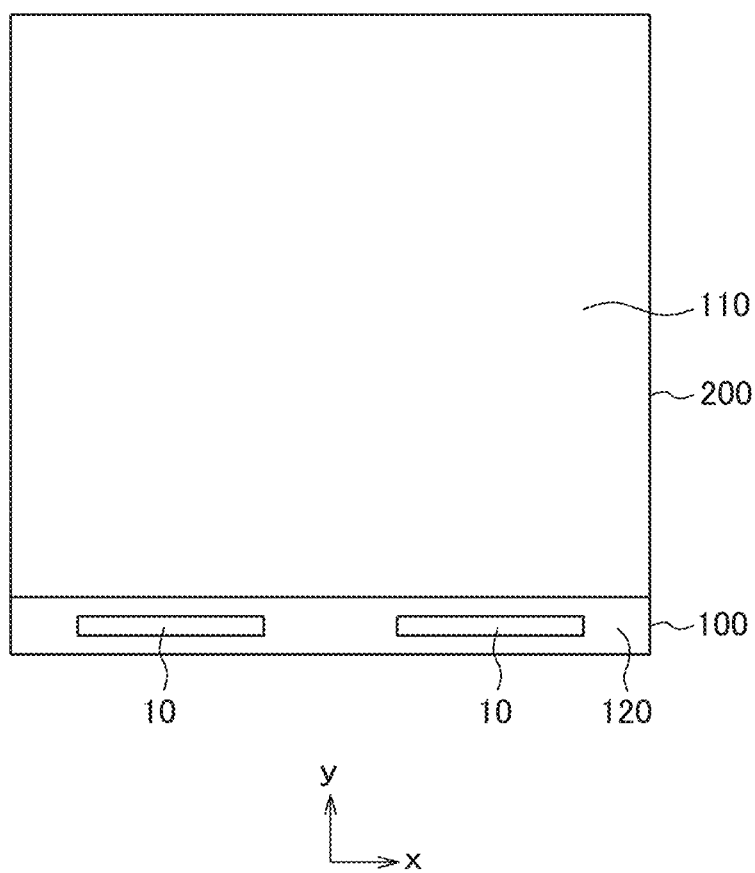
FIG. 3 is a plan view of another example of the liquid crystal display device.
Figure 4:
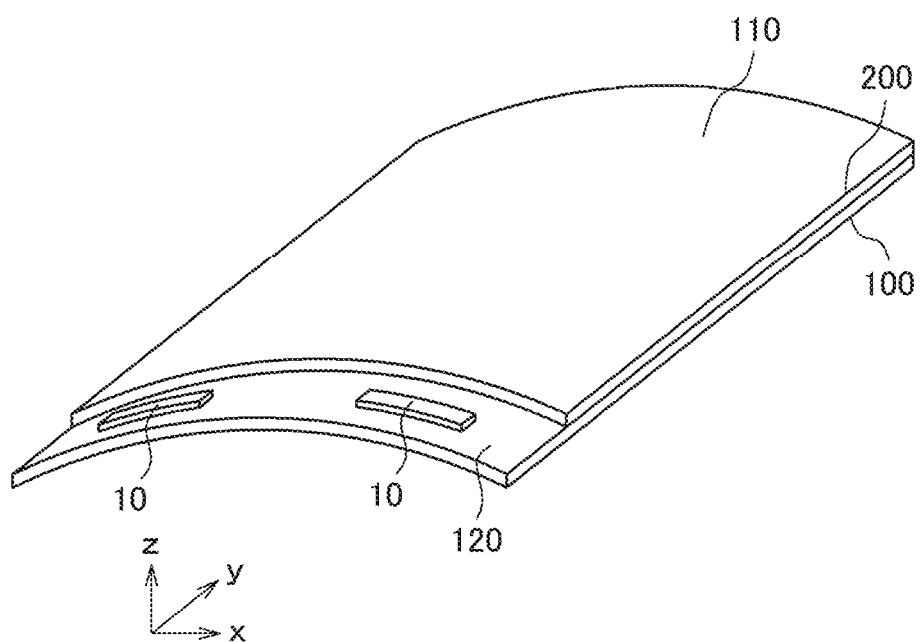
FIG. 4 is a perspective view in which the liquid crystal display device of FIG. 3 is curved.

FIG. 3 is a plan view of the display device, in which the driver IC 10 is divided into two to shorten the length of driver IC 10 to alleviate the tensile strength generated between the driver IC 10 and the terminal area 120. FIG. 4 is a perspective view when the display device of FIG. 3 is curved along the x direction. However, even the driver IC 10 is separated into two, there still remains a tensile strength at the edge of the driver IC 10 even the stress may be somewhat alleviated.

Figure 5:
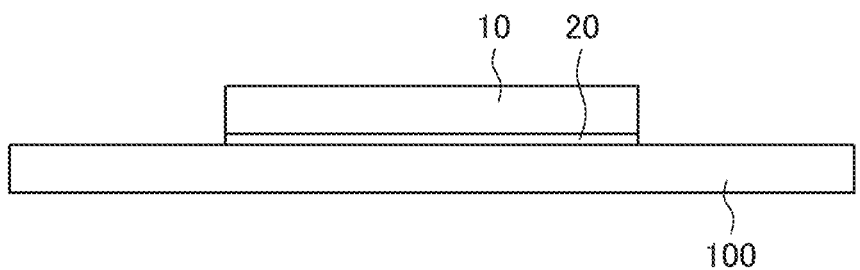
FIG. 5 is a cross sectional view along the line A-A in FIG. 1, in which the present invention is not applied.

Herein after, the explanation is made when one driver IC 10 is installed; however, the principle is the same when two or more of the driver ICs are installed as depicted in FIGS. 3 and 4. FIG. 5 is a cross sectional view along the line A-A of FIG. 1 when the present invention is not applied. In FIG. 5, the driver IC 10 is connected to the terminal area 120 of the TFT substrate 100 via the anisotropic conductive resin film 20.

Figure 6:
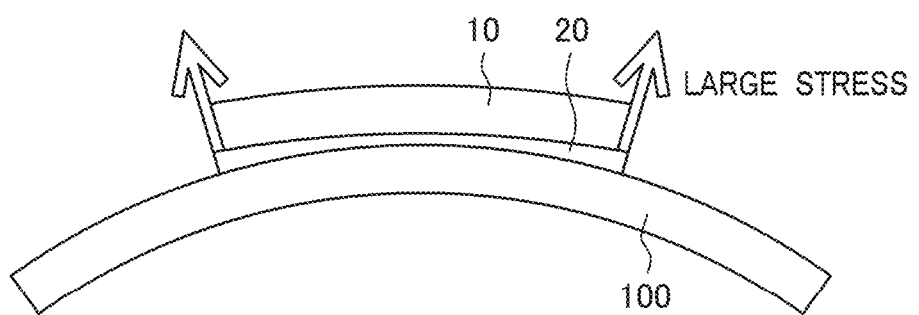
FIG. 6 is a cross sectional view along the line B-B in FIG. 2, in which the present invention is not applied.

FIG. 6 is a cross sectional view of the terminal area 120 when the display device is curved, to which the present invention is not applied. FIG. 6 corresponds to a cross sectional view along the line B-B of FIG. 2. In FIG. 6, a large tensile strength is generated in the anisotropic conductive resin film 20, which connects the driver IC 10 and the terminal area 120, at the edges of the driver IC 10. Such a tensile strength causes a danger of disconnection to occur between the display device and the driver IC 10.

Figure 7:
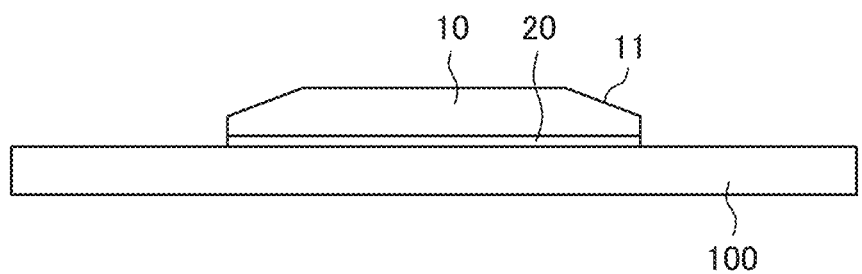
FIG. 7 is a cross sectional view along the line A-A in FIG. 1 according to the present invention.

FIG. 7 is a cross sectional view along the line A-A of FIG. 1 according to the present invention. In FIG. 7, the driver IC 10 is connected to the terminal area 120 of the TFT substrate 100 via the anisotropic conductive resin film 20. FIG. 7 differs from FIG. 5 in that a thickness of the driver IC 10 gradually becomes thinner toward the edge by forming the tapered portion 11 toward the edge of the driver IC 10.

Figure 8:
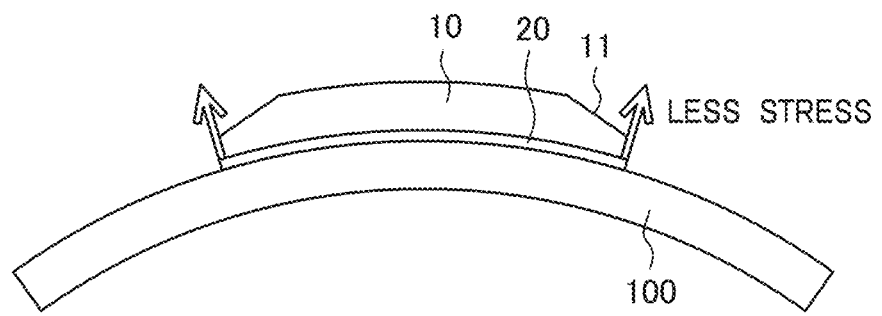
FIG. 8 is a cross sectional view along the line B-B in FIG. 2 according to the present invention.

FIG. 8 is a cross sectional view in which the liquid crystal display device of FIG. 7 is curved, which corresponds to the cross sectional view along the line B-B of FIG. 2 according to the present invention. In FIG. 8, the tapered portion 11 is formed in the driver IC 10 and a thickness of the driver IC 10 becomes thinner toward the edge of the driver IC 10; therefore, a tensile stress in the anisotropic conductive resin film 20 can be lowered when the driver IC 10 is curved. Therefore, a danger of disconnection between the driver IC 10 and the display device can be suppressed.

Figure 9:
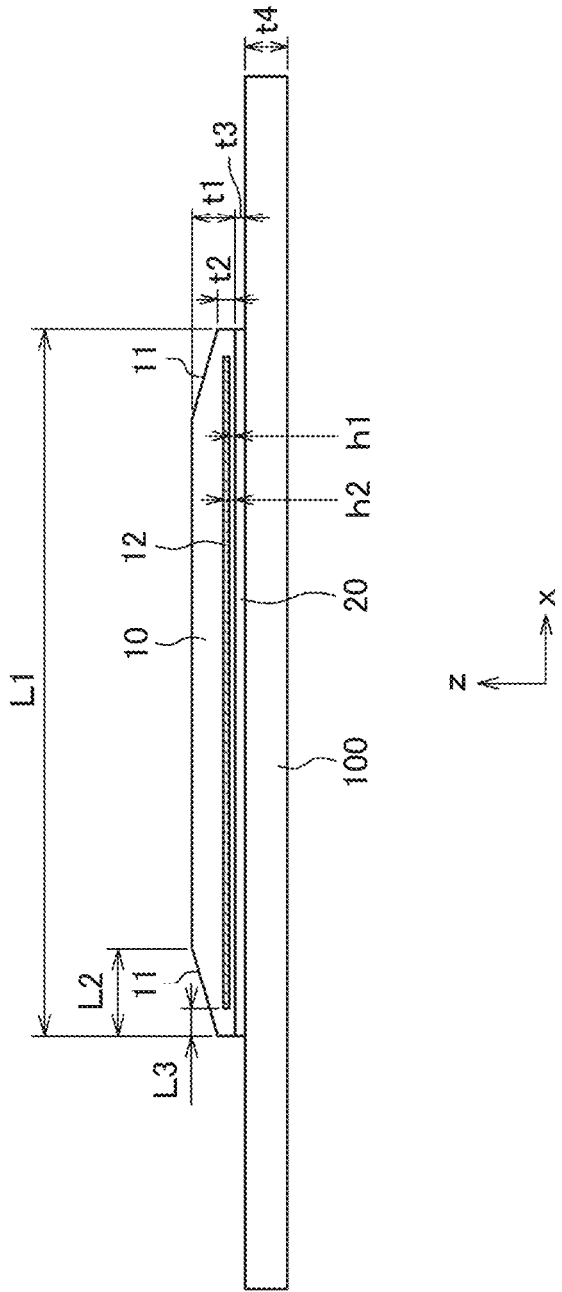
FIG. 9 is a detailed cross sectional view of FIG. 7.

FIG. 9 is a detailed cross sectional view of FIG. 7. In FIG. 9, a length of the driver IC 10 is L1 and is e.g. 30 mm; a thickness of the driver IC 10 is t1 and is e.g. 0.2 mm. The tapered portion 11 is formed in the driver IC; therefore, a thickness becomes gradually thinner toward the edge. A thickness of the driver IC at the edge is e.g. 0.05 mm.

The driver IC 10 is connected to the TFT substrate 100 via the anisotropic conductive resin film 20. A thickness of the anisotropic conductive resin film 20 is e.g. 0.02 mm. The TFT substrate 100 is formed from glass; a thickness t4 is e.g. 0.05 mm.

In FIG. 9, the circuit layer 12 is formed inside the driver IC 10. The circuit layer 12 is formed between h1 and h2 in depth direction from the bottom of the driver IC 10 in a cross sectional view; h1 is e.g. 1 micron and h2 is e.g. 3 to 5 microns. Herein after, in the driver IC 10, a side where the circuit layer 12 is formed is called a bottom surface, and its opposite side is called a top surface; a bottom surface may be called simply a first surface and a top surface may be called simply a second surface. The first surface (bottom surface) may be called the surface where the bumps 15 and dummy bumps 16 are formed; the second surface (top surface) may be called the opposite surface to the first surface where the bumps 15 and dummy bumps 16 are formed.

The tapered portion 11 is formed at the top surface near the edge of the driver IC 10; consequently, a thickness of the driver IC 10 becomes gradually thinner toward the edge. The tapered portion 11 is formed in the range of L2 from the edge of the driver IC 10. Thus, a tensile stress in the anisotropic conductive resin film 20 at the edge of the driver IC 10 is mitigated.

As depicted in FIG. 9, the edge of the circuit layer 12 is L3 from the edge of the driver IC 10; the region the tapered portion 11 is formed is in the range of L2 from the edge of the driver IC 10, and wherein L2>L1. That means the circuit layer 12 is formed to extend in the area where the tapered portion 11 is formed. However, as depicted in FIG. 9, the tapered portion is formed on the opposite surface to the surface where the circuit layer 12 is formed, and t2>h2; thus, the tapered portion 11 does not have influence on forming the circuit layer 12.

FIGS. 10 through 14 show results of simulation how the tapered portion 11 formed in the driver IC 10 as depicted in FIG. 9 has effect to the tensile strength in the anisotropic conductive resin film 20, which connects the driver IC 10 to the terminal area 120. In the meantime, in FIGS. 10 and 11, the TFT substrate 100 is substituted by the glass substrate 30 having a thickness t4 of 0.15 mm and a width w2 of 3 mm for simulation.

Figure 10:
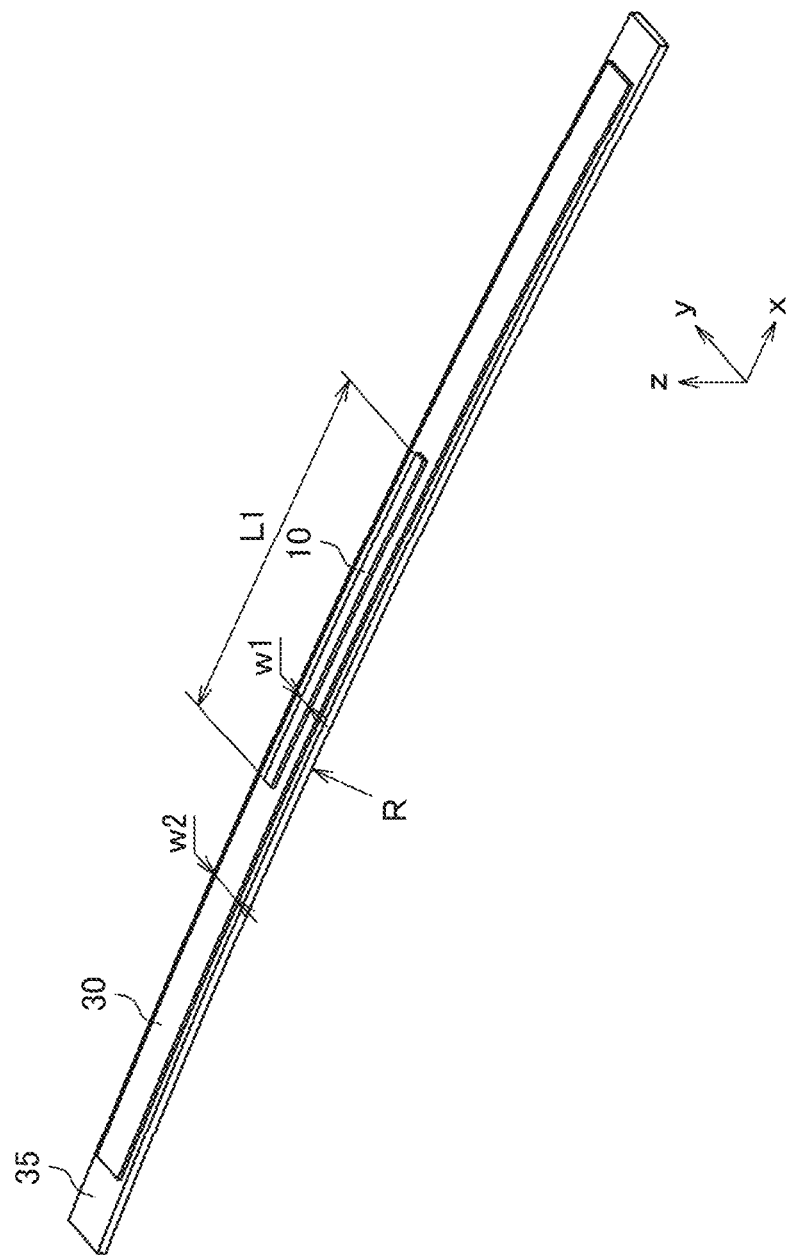
FIG. 10 is a perspective view of simulation model.

FIG. 10 is a perspective view in which the glass substrate 30 is curved along the bending jig 35 having a radius of curvature R of 750 mm. The driver IC 10 curves along the glass substrate 30. In FIG. 10, the driver IC 10 has a length L1 of 30 mm and a width W1 of 1 mm.

Figure 11:
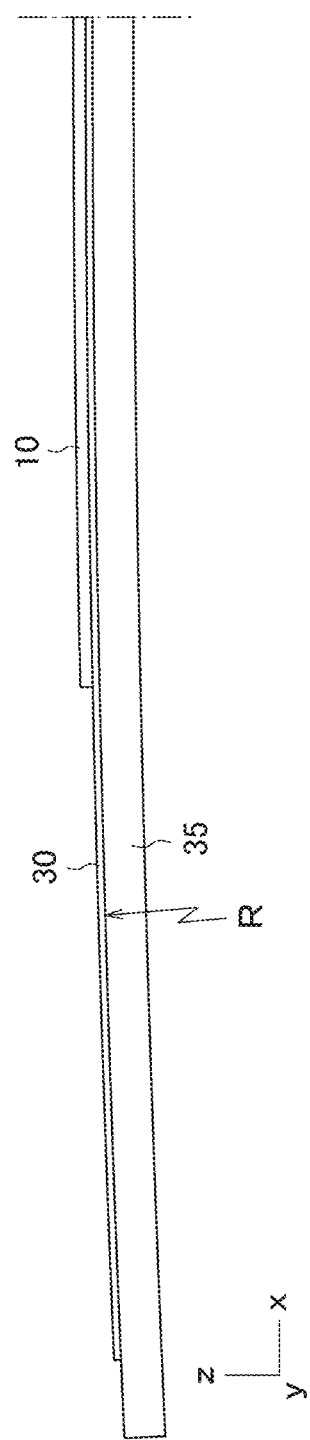
FIG. 11 is a cross sectional view of simulation model.
Figure 13:
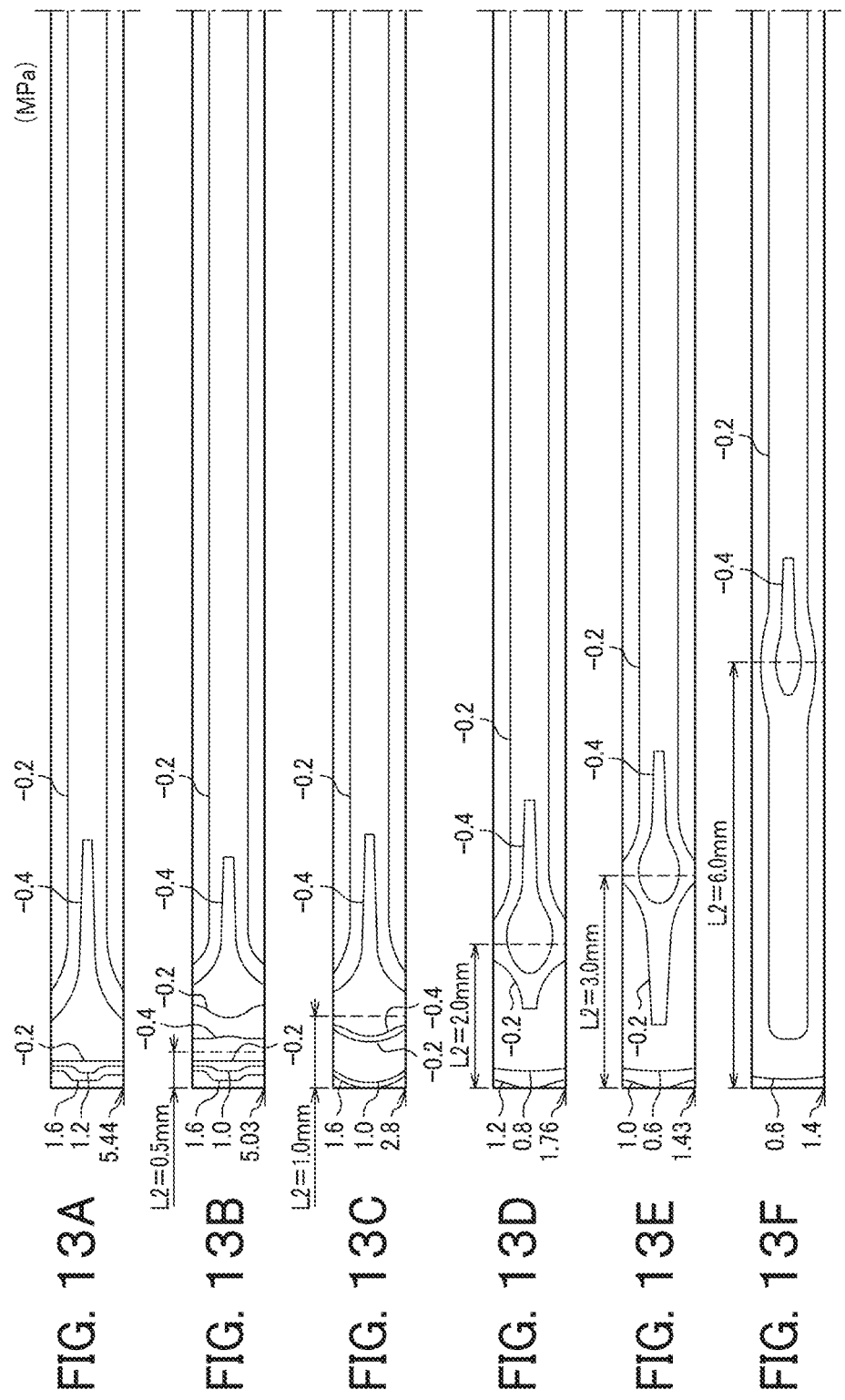
FIG. 13A is contour lines of stress in the anisotropic conductive resin film when the length L2 of the tapered portion is 0 mm.
FIG. 13B is contour lines of stress in the anisotropic conductive resin film when the length L2 of the tapered portion is 0.5 mm.
FIG. 13C is contour lines of stress in the anisotropic conductive resin film when the length L2 of the tapered portion is 1.0 mm.
FIG. 13D is contour lines of stress in the anisotropic conductive resin film when the length L2 of the tapered portion is 2.0 mm.
FIG. 13E is contour lines of stress in the anisotropic conductive resin film when the length L2 of the tapered portion is 3.0 mm.
FIG. 13F is contour lines of stress in the anisotropic conductive resin film when the length L2 of the tapered portion is 6.0 mm.

FIG. 11 is a cross sectional view of FIG. 10. In FIG. 11, the glass substrate 30 is curved along the bending jig 35 by a radius of curvature of 750 mm. The driver IC 10 disposed on the glass substrate 30 also is curved by a radius of curvature of 750 mm. The anisotropic conductive resin film is omitted in FIG. 11.

FIG. 12 is a table of Young's modulus (MPa) and Poisson's ratio of the driver IC 10, the anisotropic conductive resin film (ACF) 20 and the glass substrate 30. The evaluation is made as follows: a tensile stress or compressive stress in the anisotropic conductive resin film (ASC) 20 or on the bottom surface of the driver IC 10 is calculated when the assembled body of the driver IC 10, the anisotropic conductive resin film 20 and the glass substrate 30 is curved along the bending jig 35, which is rigid and has a surface radius of curvature of 750 mm. By the way, in this specification, the stress generated in the anisotropic conductive resin film 20 and the stress generated on the bottom surface of the driver IC 10 are the same meaning.

FIGS. 13A through 13F show contour lines that show tensile stress or compressive stress generated in the anisotropic conductive resin film 20 when a length of the tapered portion 11 near the edge of the driver IC 10, namely, the length L2 in FIG. 9, is changed; in other words, contour lines mean tensile stress or compressive stress generated on the bottom surface of the driver IC 10. The conditions for the simulation are: a length of the driver IC 10 is 30 mm, a thickness of the driver IC 10 is 0.2 mm, a thickness of the driver IC 10 at the edge is 0.05 mm, a width of the driver IC 10 is 1 mm, a thickness of the anisotropic conductive resin film 20 is 0.02 mm and a thickness of the glass substrate 30 is 0.15 mm.

FIG. 13A is when the region L2 of the tapered portion 11 is 0 mm (conventional structure), FIG. 13B is when the region L2 of the tapered portion 11 is 0.5 mm, FIG. 13C is when the region L2 of the tapered portion 11 is 1.0 mm, FIG. 13D is when the region L2 of the tapered portion 11 is 2.0 mm, FIG. 13E is when the region L2 of the tapered portion 11 is 3.0 mm, and FIG. 13F is when the region L2 of the tapered portion 11 is 6.5 mm. The unit of values of contour lines in FIGS. 13A through 13F is MPa (Mega Pascal). When the values are plus, a tensile stress is generated in the anisotropic conductive resin film 20; when the values are minus, a compressive stress is generated in the anisotropic conductive resin film 20.

As shown in FIG. 13A through FIG. 13F, a large tensile stress is generated at the edge of the driver IC 10; small compressive stress is generated inward from the edge of the driver IC 10. Since a compressive stress is small, it does not raise a problem. The problem is a tensile stress at the edge of the driver IC 10.

As shown by contour lines in FIGS. 13A through 13F, the tension at the edge of the driver IC 10 becomes smaller according to the length L2 becomes longer. In each of FIGS. 13A through 13F, the value accompanied with the arrow is a maximum stress at the edge of the driver IC under each of the conditions. The maximum stress is generated at the edge, especially at the corner, of the driver IC 10. A disconnection between the driver IC 10 and terminal area 120 of the display device relates with the maximum stress. This maximum stress decreases with an increase of L2.

Figure 14:
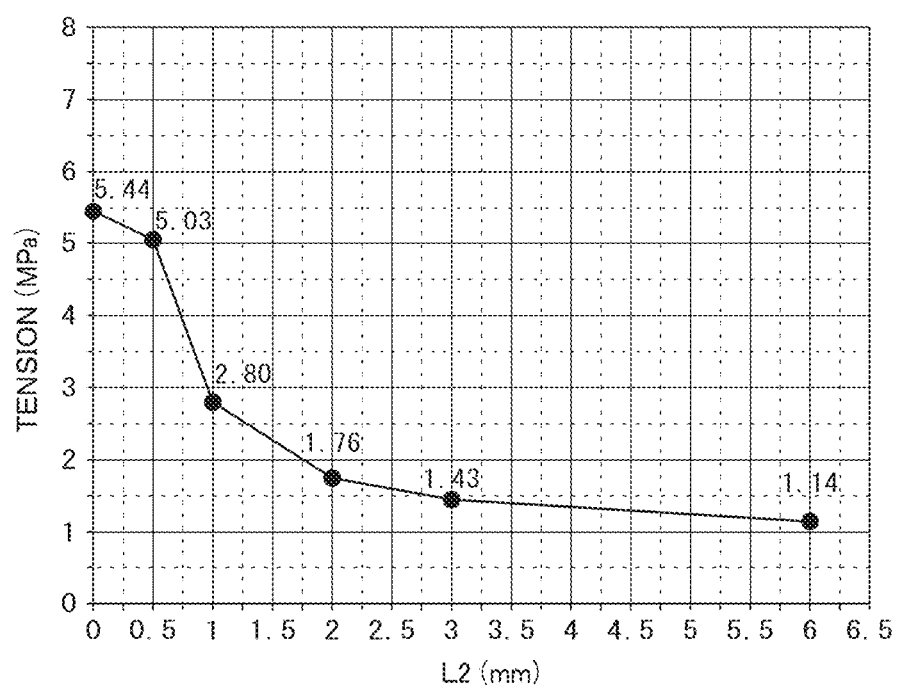
FIG. 14 is a graph that shows a relation between the length of the tapered portion L2 and the maximum tensile strength in the anisotropic film.

FIG. 14 is a graph that shows a change in maximum tensile stress when a length of the tapered portion 11 is changed; the length of the tapered portion 11 is the length L2 shown in FIG. 9 and FIG. 13A through FIG. 13F. In FIG. 14, the condition of L2=0 is the case where the present invention is not used. As shown in FIG. 14, the tensile stress drastically decreases when L2 becomes 0.5 mm or more. When L2=0.75 mm, the tensile stress becomes 70% compared with the stress when L2=0 mm. Further, when L2=0.9 mm, the tensile stress becomes 50% compared with the stress when L2=0 mm, namely, half of the stress of when L2=0 mm. In other words, when L2 becomes 0.5 mm or more, the effect becomes large; when L2 becomes 0.75 mm or more, the effect becomes conspicuous; when L2 becomes 0.9 mm or more, the tensile stress becomes half of the stress compared with the stress when L2 is 0 mm. By the way, when L2 is 0.9 mm, the length of the tapered portion is 3% of the length L1 of the driver IC 10.

The effect further increases when L2 is 1.5 mm, namely the length L2 of the tapered portion 11 is about 5% of the length L1 of the driver IC 10, the tensile stress becomes 42% compared with the stress when L2 is 0 mm. On the other hand, when L2 becomes 3 mm or more, the decrease in the tensile stress tends to saturate. For example, even when L2 is 6 mm, the tensile stress is about 80% of the stress when L2 is 3 mm. Therefore, considering the effect of decrease in the tensile stress and easy fabrication of the driver IC 10, L2 is preferably 5 mm or less, more preferably 3 mm or less, and further preferably 1.5 mm or less. By the way, the tensile stress when L2 is 3 mm is 26.3% compared with the stress when L2 is 0 mm; and the tensile stress when L2 is 5 mm is 23.0% compared with the stress when L2 is 0 mm.

Considering the above circumstances, a preferable range of L2 is between 0.5 mm and 5 mm, more preferably between 0.75 mm and 3 mm, and further preferably between 0.9 mm and 1.5 mm. By the way, the tapering angle of the tapered portion 11, namely the angle θ in FIG. 9, is 16.7 degree when L2 is 0.5 mm, 11.3 degree when L2 is 0.75 mm, 9.5 degree when L2 is 0.9 mm, 5.7 degree when L2 is 1.5 mm, 2.9 degree when L2 is 3 mm, and 1.7 degree when L2 is 5 mm.

In the simulation, a thickness at the edge of the driver IC 10, which is t2 in FIG. 9, is 0.05 mm when the tapered portion 11 is formed in the driver IC. When t2 is too small, the driver IC 10 tends to have a chip in the edge specifically when the tapering angle of the tapered portion 11, namely, θ in FIG. 9, is small. Therefore, a thickness of the edge of the driver IC 10 is preferably 0.05 mm or more when the tapered portion 11 is formed.

The above explanation has been made when the tapered portion 11 is linear. The tapered portion, however, is not necessarily to be linear, but it can be made curved shape. For example, a curved tapered portion may be preferable when a certain value of a thickness t2 in the edge of the driver IC 10 is required.

Figure 15:
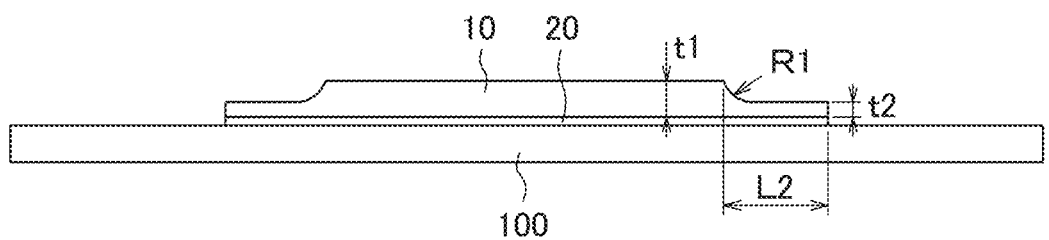
FIG. 15 is another example of the tapered portion.

FIG. 15 is when the tapered portion 11 is made with rather small radius of curvature R1. In this case, when L2 is large, a mechanical strength of the driver IC 10 in the tapered portion 11 tends to be weak, therefore, a thickness t2 in the edge of the driver IC 10 is e.g. about a half of a thickness t1 of the driver IC 10.

Figure 16:
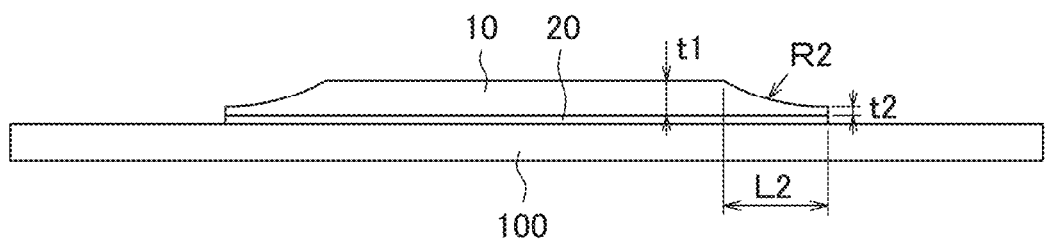
FIG. 16 is yet another example of the tapered portion.

FIG. 16 is when the tapered portion 11 is made with rather large radius of curvature R2. In this case, a thickness t2 in the edge of the driver IC 10 can be e.g. about ¼ of a thickness t1 of the driver IC 10.

Figures 17, 18:
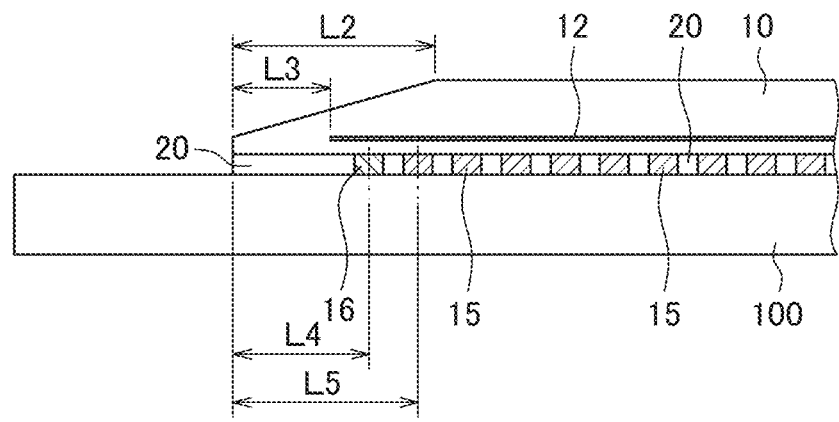
FIG. 17 is a cross sectional view of a connection between the driver IC and the terminal area of the TFT substrate.
FIG. 18 is a table that shows examples of lengths of the tapered portions and positions of dummy bumps.

FIG. 17 is a cross sectional view that shows a relation between the tapered portion 11 and the bumps 15 of the driver IC 10. The bumps 15 of the driver IC 10 and the terminals formed in the terminal area of the display device are connected by conductive particles in the anisotropic conductive resin film 20. The conductive particles, however, are omitted in FIG. 17.

On the driver IC 10, bumps 15 for input and output of signals are formed, and dummy bumps 16 to prevent the bumps 15 being peeled off are formed outside of the bumps 15. In FIG. 17, the length L4, which is a length between the edge of the driver IC 10 and a center of the dummy bump 16, is smaller than the length L2 of the tapered portion 11. In FIG. 17, the length L5, which is a length between the edge of the driver IC 10 and a center of the normal bump 15, is smaller than the length L2 of the tapered portion 11.

FIG. 18 is dimensional examples for the length L1 of the driver IC 10, the length L2 of the tapered portion 11, the length L4, which is a length between the edge of the driver IC 10 and a center of the dummy bump 16 in FIG. 17. In FIG. 18, examples of the lengths L1 of the driver IC 10 are 30 mm and 20 mm; examples of the lengths L2 are 3% and 5% of the length L1 of the driver IC 10.

On the other hand, examples of length L4, which is a length between the edge of the driver IC 10 and the center of the dummy bump 16, are 20% to 50% of the length L2 of the tapered portion 11. As shown in FIG. 18, the dummy bump 16 can be formed near to the edge of the driver IC 10. Even in such a structure, the dummy bump 16 can be connected to the terminal with a necessary bonding pressure when the pressure bonding methods described in embodiment 2 and embodiment 3 are taken.

Embodiment 2

The driver IC 10 and the terminal in the display device is bonded via anisotropic conductive resin film 20 through thermal pressure bonding. When the tapered portion 11 is formed at the edge of the driver IC 10 as depicted in FIG. 17, a enough pressure cannot be applied to the area where the tapered portion 11 is formed when a normal pressure head, which has a flat surface and for normal thermal pressure bonding, is used.

Figure 19:
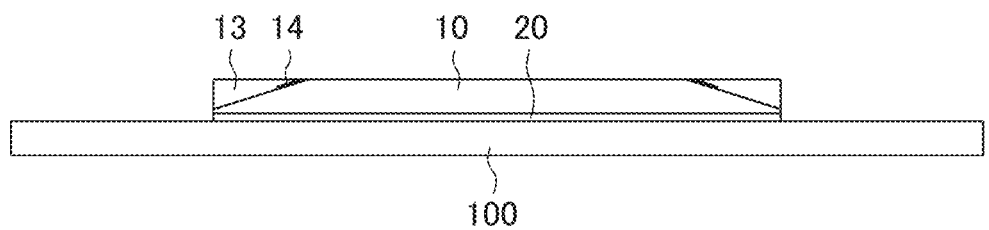
FIG. 19 is a cross sectional view in which the driver IC is connected to the terminal area according to embodiment 2.

FIG. 19 is a cross sectional view of the structure that counter measures the above described problem. In FIG. 19, the pressure resistant auxiliary resin 13 is set on the tapered portion 11 of the driver IC 10; thus, a pressure can be applied with the pressure head up to the edge of the driver IC 10. The pressure resistant resin 13 can be made of e.g. polyethylene terephthalate (PET), polycarbonate (PC), or epoxy resin and so forth.

In the meantime, if the auxiliary resin 13 is rigid, it will weaken the effect to decrease the tensile stress when the terminal area is curved even if the tapered portion 11 is formed in the driver IC 10. In FIG. 19, to prevent this problem, the adhesive 14 is applied only to a part of the auxiliary resin 13 to avoid strong adherence between the auxiliary resin 13 and the driver IC 10. By the way, the adhesive 14 is preferably set near the initial portion of the tapered portion 11, which is reverse side from the edge of the driver IC 10.

The purpose of the auxiliary resin 13 is to transfer the pressure from the pressure head to the bump in thermal pressure process; the auxiliary resin 13 can be removed after the driver IC 10 is connected. If the adhesive 14 exists only at a part of the tapered portion 11, it will not substantially deteriorate the effect to decrease the tensile stress when the terminal area is curved even when the auxiliary resin 13 is not removed.

An adhesive substance can be used in substitution of the auxiliary resin 13. The rigidity of the adhesive substance, after curing, needs to be less than the rigidity of the driver IC 10. Further, if the adhesive substance is adhered to only a part of the tapered portion 11 by applying surface treatment on the tapered portion 11, the effect to decrease the tensile stress, when the terminal area is curved, is not substantially deteriorated.

Figure 20:
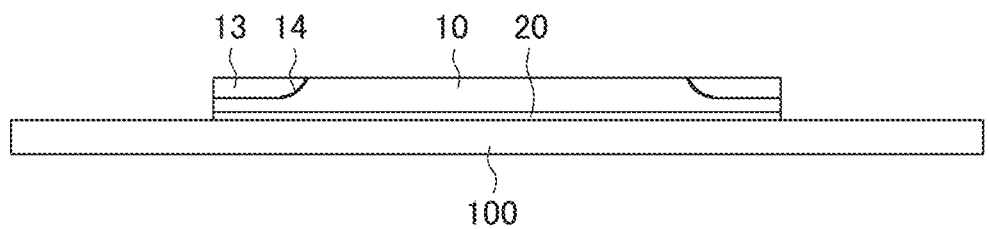
FIG. 20 is another example of embodiment 2.
Figure 21:
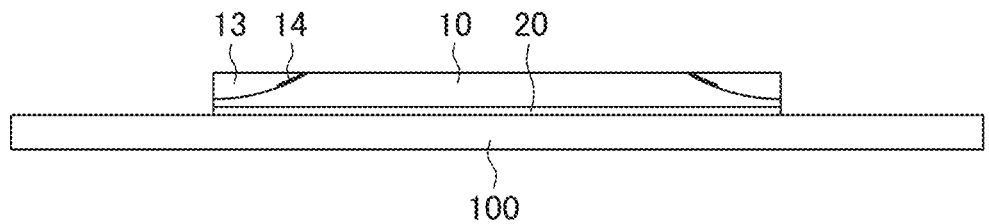
FIG. 21 is yet another example of embodiment 2.

FIG. 20 is an example when the tapered portion 11 is formed from a combination of a curve of small radius of curvature and a line; FIG. 21 is an example when the tapered portion 11 is formed from a curve of a large radius of curvature. A disposition and an effect of the pressure resistant auxiliary resin or of the adhesive substance in those cases are the same as explained in FIG. 19.

Embodiment 3

The driver IC 10 is bonded to the substrate 100 via the anisotropic conductive resin film 20 through thermal pressure bonding. The thermal pressure bonding is performed by pressing the thermal pressure bonding head 51 to the driver IC 10 through the spacer 50. The spacer 50 is generally formed by Teflon. Generally, the spacer 50 is a flat plate; however, in this embodiment, the spacer 50 is fabricated to fit along the top surface of the driver IC 10.

Figure 22:
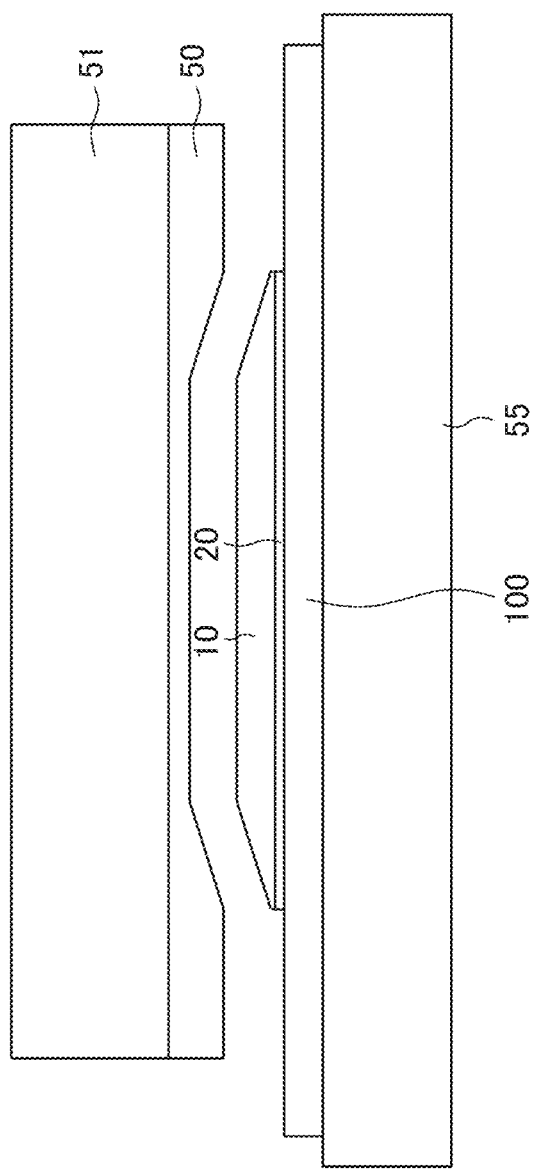
FIG. 22 is a cross sectional view in which the driver IC is connected to the terminal area with a pressure head and a spacer according to embodiment 3.

FIG. 22 is a cross sectional view that shows the structure of the present embodiment. The TFT substrate 100 is set on the base 55; the driver IC 10 is disposed on the TFT substrate 100 via the anisotropic conductive film 20. The thermal pressure bonding head 51 is disposed above the driver IC 10; the spacer 50 is disposed on the bottom surface of the thermal pressure bonding head 51. The bottom surface of the spacer 50 has the same shape as the top surface of the driver IC 10.

When the driver IC 10 is pressed by lowering the thermal pressure bonding head 51 of FIG. 22, the tapered portion 11 can be pressed with the same pressure as the center of the driver IC 10. Therefore, enough pressure can be applied to the bumps or dummy bumps disposed in the area corresponding to the tapered portion 11.

By the way, in the manufacturing process in embodiment 2 or embodiment 3, the driver IC 10 having a tapered portion 11 is installed on the flat substrate, and after that, the substrate is curved.

Embodiment 4

Figure 23:
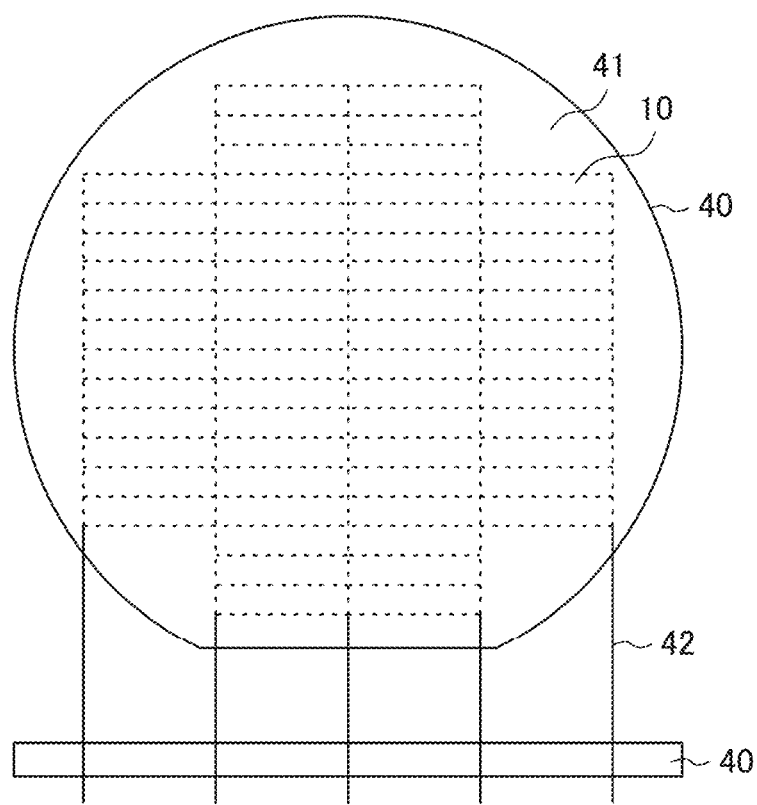
FIG. 23 is a plan view of top surface of the silicon wafer.

Embodiment 4 presents manufacturing method of the tapered portion 11 of the driver IC 10. FIG. 23 is a plan view in which many IC chips 10 are formed on the silicon wafer 40. By the way, FIG. 23 is a top surface 41 of the silicon wafer 40. Individual IC chips 10 are separated from the silicon wafer 40 by dicing from the top surface 41 of the silicon wafer 40. In FIG. 23, the broken lines and the following solid lines 42 are separating lines to separate individual IC chips 10.

Figure 24:
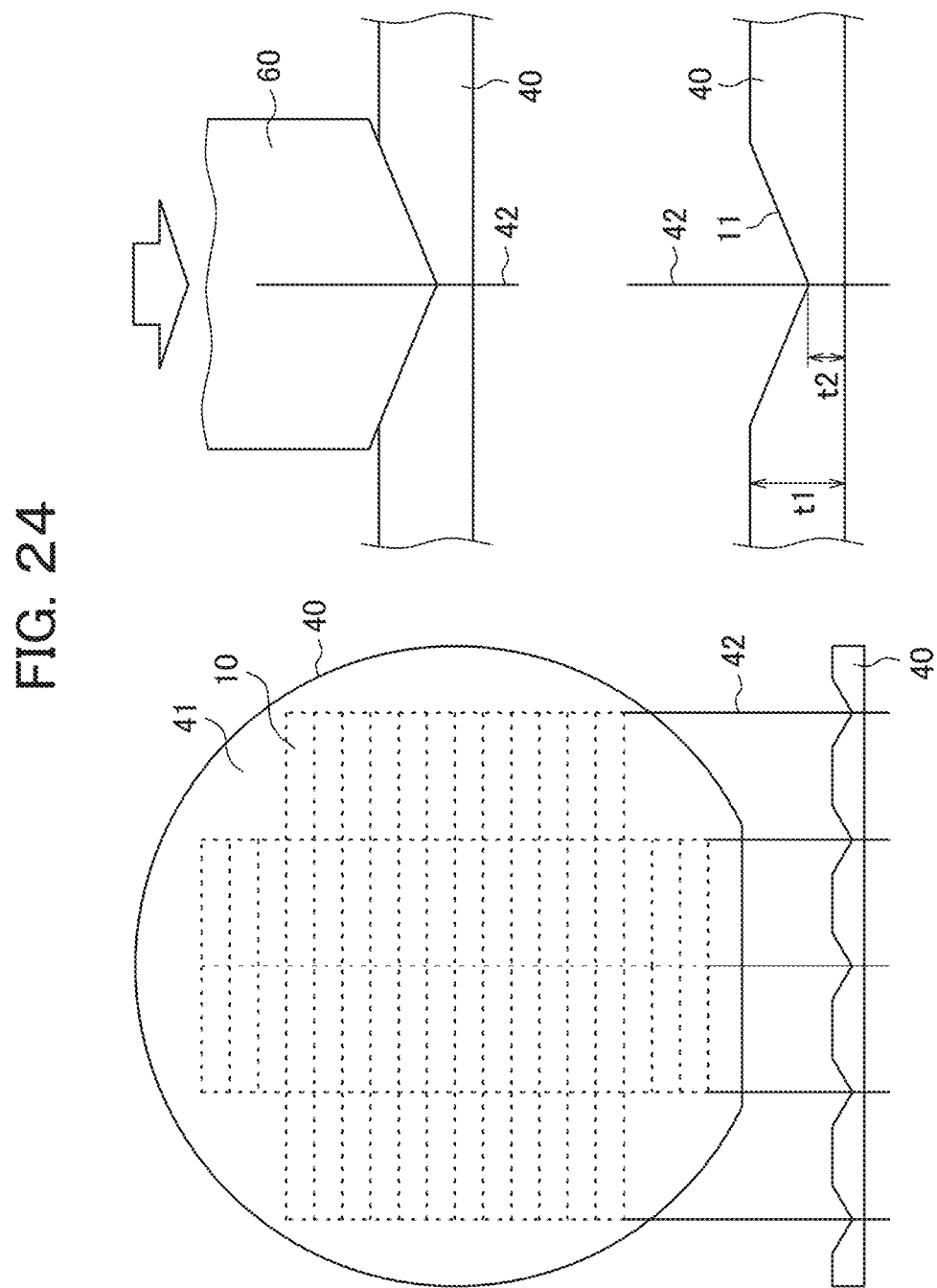
FIG. 24 is a cross sectional view in which the tapered portion is formed on the IC chip with the first blade.

FIG. 24 is a cross sectional view of manufacturing process to form the tapered portion 11 on the IC chip 10. In the right hand side of FIG. 24, the silicon wafer 40 is cut along the separating line 42 by the taper forming blade 60 until a thickness of the wafer becomes t2. A necessary taper for the IC chip 10 can be formed by changing the angle of the tip of the taper forming blade 60.

After that, as depicted in FIG. 25, the individual ICs are separated from the silicon wafer 40 along the separating lines 42 by dicing blade 70. As to the dicing blade 70, a conventional dicing blade can be used.

In FIGS. 24 and 25, the tapered portion of the driver IC 10 is line shaped; however, the taper can be formed in any curves by changing the shape of the tip of the taper forming blade 60.

What is claimed is:

1. An electronic device comprising: a driver IC installed in a terminal area, the terminal area being curved,
   wherein the driver IC has a circuit and a plurality of bumps,
   the driver IC has a tapered portion formed on an opposite surface to a surface on which the plurality of bumps are formed, and
   the tapered portion overlaps with an outermost bump of the plurality of bumps.

2. The electronic device according to claim 1,
   wherein a length of a region where the tapered portion is formed is 0.5 mm or more and 5.0 mm or less.

3. The electronic device according to claim 1,
   wherein a length of a region where the tapered portion is formed is 0.75 mm or more and 3.0 mm or less.

4. The electronic device according to claim 1,
   wherein a length of a region where the tapered portion is formed is 0.9 mm or more and 1.5 mm or less.

5. The electronic device according to claim 1,
   wherein, in a cross sectional view, a top surface of the tapered portion is linear.

6. The electronic device according to claim 1,
   wherein, in a cross sectional view, a top surface of the tapered portion is curved.

7. The electronic device according to claim 1,
   wherein a thickness of an edge of the driver IC is 0.05 mm or more.

8. The electronic device according to claim 7,
   wherein a tapering angle of the tapered portion of the driver IC is 16.7 degree or less and 5.2 degree or more.

9. The electronic device according to claim 1,
   wherein the circuit of the driver IC overlaps with the outermost bump of the plurality of bumps, and
   in a state that the driver IC is flat, the outermost bump and the circuit overlap with the tapered portion.

10. The electronic device according to claim 1,
    wherein the driver IC has a dummy bump that is formed outside of the outermost bump of the plurality of bumps, and
    the dummy bump overlaps with the tapered portion.

11. The electronic device according to claim 1,
    wherein a resin is formed on the tapered portion of the driver IC.

12. A manufacturing method of for an electronic device comprising:
    the electronic device including a driver IC installed in a terminal area, the terminal area being curved,
    the driver IC has a circuit and a plurality of bumps, and
    the driver IC has a first surface on which the plurality of bumps are formed, and a second surface on which a tapered portion is formed, the second surface is being an opposite surface to the first surface,
    the tapered portion overlaps with an outermost bump of the plurality of bumps and the circuit,
    the manufacturing method including:
    connecting the driver IC to the terminal area via an anisotropic conductive resin film by thermal compression with a pressure head having a spacer,
    the spacer is thinner at a place corresponding to a center of the driver IC than at a place corresponding to the tapered portion of the driver IC.

13. The manufacturing method of an electronic device according to claim 12,
    wherein a surface of the spacer that is opposite to the driver IC is formed to conform to the second surface of the driver IC.

14. A manufacturing method of a driver IC comprising:
    the driver IC including a first surface where a plurality of bumps are formed, and a second surface where a tapered portion is formed, the second surface being an opposite surface to the first surface,
    the tapered portion overlapping with the circuit,
    the tapered portion overlapping with an outermost bump of the plurality of bumps,
    the manufacturing method including:
    forming the tapered portion by scribing a silicon wafer along a separating line with a first blade of which a tip has a taper, and after that, singulating the driver IC from the silicon wafer using with a second blade.

15. The manufacturing method of a driver IC according to claim 14, wherein a thickness of the first blade is greater than a thickness of the second blade.

\* \* \* \* \*